United States Patent
Ballantine et al.

(10) Patent No.: US 6,444,592 B1
(45) Date of Patent: Sep. 3, 2002

(54) INTERFACIAL OXIDATION PROCESS FOR HIGH-K GATE DIELECTRIC PROCESS INTEGRATION

(75) Inventors: Arne W. Ballantine, Round Lake; Douglas A. Buchanan, Cortlandt Manor; Eduard A. Cartier, New York; Kevin K. Chan, Staten Island; Matthew W. Copel, Yorktown Heights; Christopher P. D'Emic, Ossining; Evgeni P. Gousev, Mahopac; Fenton Read McFeely, Ossining; Joseph S. Newbury, Tarrytown; Harald F. Okorn-Schmidt, Putnam Valley; Patrick R. Varekamp, Croton-on-Hudson; Theodore H. Zabel, Yorktown Heights, all of NY (US)

(73) Assignee: International Business Machines Corporation, Armonk, NY (US)

(*) Notice: Subject to any disclaimer, the term of this patent is extended or adjusted under 35 U.S.C. 154(b) by 21 days.

(21) Appl. No.: 09/597,765

(22) Filed: Jun. 20, 2000

(51) Int. Cl.[7] .............................................. H01L 21/469
(52) U.S. Cl. ...................................................... 438/770
(58) Field of Search ................................ 438/758, 769, 438/770, 775, 785; 257/410

(56) References Cited

U.S. PATENT DOCUMENTS

| | | | |
|---|---|---|---|
| 3,479,237 A | 11/1969 | Bergh et al. | |
| 3,735,482 A | 5/1973 | Norris et al. | |
| 3,766,637 A | 10/1973 | Norris et al. | |
| 5,360,769 A | 11/1994 | Thakur et al. | |
| 5,869,405 A | 2/1999 | Gonzalez et al. | |
| 5,872,031 A | 2/1999 | Mishra et al. | |
| 5,972,800 A | 10/1999 | Hasegawa | |
| 6,025,280 A | 2/2000 | Brady | |
| 6,320,238 B1 * | 11/2001 | Kizilyalli et al. | 257/410 |

OTHER PUBLICATIONS

Wolf, Silicon Processing for the VLSI Era, vol. 2, pp. 434–435.*

E.M. DaSilva, et al., "Fabrication of Aluminum Oxide Films", IBM Technical Disclosure Bulletin, vol. 4, No. 6, Dec. 1961.

* cited by examiner

*Primary Examiner*—Michael Sherry
*Assistant Examiner*—Lisa Kilday
(74) *Attorney, Agent, or Firm*—Margaret A. Pepper

(57) ABSTRACT

A method for integrating a high-k material into CMOS processing schemes is provided. The method includes forming an interfacial oxide, oxynitride and/or nitride layer on a device region of a semiconductor substrate, said interfacial layer having a thickness of less than 10 Å; and (b) forming a high-k dielectric material on said interfacial oxide, oxynitride and/or, nitride layer, said high-k dielectric having a dielectric constant, k, of greater than 8.

22 Claims, 1 Drawing Sheet

INTERFACIAL OXIDATION PROCESS FOR HIGH-K GATE DIELECTRIC PROCESS INTEGRATION

DESCRIPTION

1. Field of the Invention

The present invention relates to complementary metal oxide semiconductor (CMOS) devices, and mote particularly to a method of integrating a material having a high-dielectric constant (permittivity), i.e., high-k, into a semiconductor processing scheme such that the deposition of the high-k material does not adversely effect the active device region present in a semiconductor substrate.

2. Background of the Invention

Dielectric materials in high density circuits appear as capacitors in dynamic random access memory (DRAM) applications, gate dielectrics in transistors and as decoupling capacitors. The dielectric materials in these structures are typically silicon dioxide ($SiO_2$), silicon nitride ($Si_3N_4$) or any combination thereof. These dielectric materials typically have a relative dielectric constant of 8.0 or below.

As today's generation of circuits become smaller and smaller, the dielectric materials employed therein must be made thinner to satisfy circuit requirements. The use of ultra-thin, conventional relatively low-dielectric constant materials in today's circuits is undesirable since such materials lead to leaky circuits. Thus, it would be beneficial if the dielectric constant of the dielectric material used in such circuits could be increased.

A variety of high-dielectric constant materials such as binary metal oxides including aluminum oxide ($Al_2O_3$), zirconium oxide ($ZrO_2$), hafnium oxide ($HfO_2$), lanthanum oxide ($La_2O_3$), titanium oxide ($TiO_2$), as well as their silicates and aluminates; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate are known in the art.

Binary metal oxides, perovskite-type oxides and other like high-k materials are typically deposited at temperatures of about 400° C. or more. Very often, oxide deposition followed by high-temperature activation anneals up to 1000° C. will be employed. At such high-temperatures, if deposited directly on silicon, interfacial layers form which may degrade device performance. In addition, grain boundary leakage paths and lowered barrier heights may result which could lead to high-device leakage.

In order to integrate high-k materials into current CMOS processing schemes, an interfacial layer composed of an oxide, oxynitride or nitride is oftentimes formed between the device silicon and the deposited high-k material. The function of the interfacial layer is to:

(i) passivate dangling bonds at the surface of the silicon wafers and form a high-quality interface with a low-density of defects;

(ii) create a barrier against interfacial reactions and diffusion into the channel area of a metal oxide semiconductor field effect transistor (MOSFET);

(iii) separate the high-k material from the silicon surface in order to remove charge/traps in the high-k material from the interface; and (iv) prevent diffusion of dopants and impurities through a gate dielectric.

Moreover, due to parasitic effect of series capacitance, the thickness of the interfacial layer should be minimal (less than 10 Å) to achieve the total equivalent oxide thickness (EOT) of a gate stack, i.e., interfacial oxide and high-k dielectric, that is less 15 Å.

No prior art method known to the applicants is capable of providing an interfacial oxide, oxynitride or nitride layer satisfying the above mentioned requirements. Thus, there is a great need in the semiconductor industry to provide a method in which an ultra-thin interfacial oxide, oxynitride or nitride layer can be formed between the device silicon and the deposited high-k material that satisfies one or more of the above mentioned requirements.

SUMMARY OF THE INVENTION

The present invention provides a method of fabricating an ultra-thin interfacial oxide, oxynitride and/or nitride layer that can be utilized between active device regions present in a semiconductor substrate and a high-k material which satisfies one or more of the requirements mentioned in the background section of this application. That is, the inventive method provides an interfacial oxide, oxynitride and/or nitride layer that (i) passivates dangling bonds at the surface of a semiconductor wafer and forms a high-quality interface with a low-density of defects; (ii) creates a barrier against interfacial reactions and diffusion into the channel area (active device region) of a metal oxide semiconductor field effect transistor (MOSFET); (iii) separates the high-k material from the semiconductor surface in order to remove charge/traps in the high-k material from the interface; and (iv) prevents diffusion of dopants and impurities through a gate dielectric.

Moreover, the inventive method is capable of forming a thin interfacial oxide, oxynitride and/or nitride layer having a thickness of less than 10 Å; therefore reducing the parasitic effect of series capacitance which is typically present in prior art CMOS devices.

Specifically, the inventive method, which achieves all of the above objects and advantages, comprises the steps of:

(a) forming an interfacial layer on an active device region of a semiconductor substrate, said interfacial layer comprising an oxide, oxynitride, nitride or mixtures and multilayers thereof having a thickness of less than 10 Å; and (b) forming a high-k dielectric material on said interfacial layer, said high-k dielectric material having a dielectric constant, k, of greater than 8.

The above processing steps can be integrated with other well known conventional logic processing steps that are capable of forming transistors, capacitors, decoupling capacitors, BiCMOS devices, and other like devices on the high-k dielectric material.

In the present invention, the term "ultra-thin interfacial layer" is used to describe the oxide, oxynitride and/or nitride layer formed in step (a) above. The ultra-thin interfacial layer is formed in the present invention utilizing a rapid thermal oxidation (RTO), a rapid thermal oxynitridation or a rapid thermal nitridation process at reduced or atmospheric pressure; a remote or direct plasma oxidation or oxynitridation process; a wet chemical oxidation process; an ozone process; or a low-energy oxygen implantation following by a rapid thermal annealing process.

Each of the above-mentioned processing techniques that can be used in forming the ultra-thin interfacial oxide, oxynitride or nitride layer, including variations thereto, will be described in more detail hereinbelow.

DETAILED DESCRIPTION OF THE INVENTION

Figure 1:
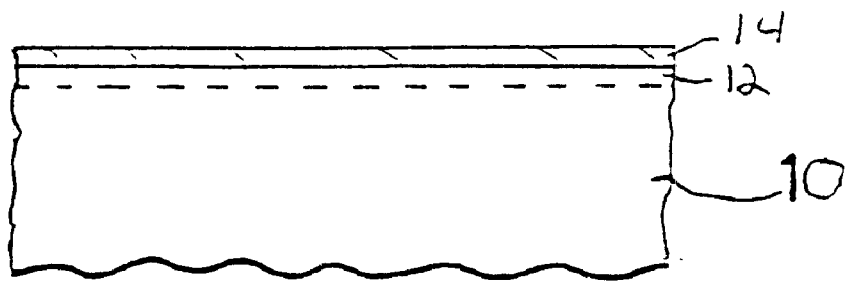
FIGS. 1–2 are cross-sectional views showing the basic processing steps of the present invention that are used in forming an ultra-thin interfacial layer between the active device region of a semiconductor substrate and a high-k dielectric material.

The present invention which provides an ultra-thin interfacial oxide, oxynitride and/or nitride layer for use with a high-k dielectric will now be described in more detail by referring to the drawings that accompany the present application. It is noted that in the accompanying drawings like and/or corresponding elements are referred to by like reference numerals.

Reference is first made to FIG. 1 which illustrates a semiconductor structure that is formed after conducting the first step of the present invention, i.e., after forming an ultra-thin interfacial oxide, oxynitride and/or nitride layer on a surface of a semiconductor substrate containing at least one active device region therein. Specifically, the structure of FIG. 1 comprises a portion of a semiconductor structure including semiconductor substrate 10 having at least one active device region 12 formed therein. An ultra-thin interfacial oxide, oxynitride and/or nitride layer 14 is shown on the active device region (channel) of the structure.

Semiconductor substrate (i.e., wafer or chip) 10 employed in the present invention is composed of any semiconducting material, including, but not limited to: Si, Ge, SiGe, GaP, InAs, InP and all other III/V compound semiconductors. The substrate may also be composed of a layered semiconductor such as Si/SiGe or Si/SiO$_2$/Si. The substrate may be of the n or p-type depending on the type of device or devices to be fabricated. Moreover, the substrate may contain various isolation regions such as shallow trench isolation (STI) regions, LOCOS (local oxidation of silicon) regions or other like isolation regions either formed in the substrate or on a surface thereof. Additionally, the substrate may include diffusion regions therein. For clarity, the isolation and diffusion regions are not shown in the drawings of the present invention, but are nevertheless intended to be included with substrate 10. Of the various substrates mentioned above, it is preferred that substrate 10 be composed of Si.

Active device region 12 includes any region in which electrons are allowed to flow freely therethrough. For example, the active device region may be a channel region of a transistor in which electrons can freely migrate from the source region to the drain region. It should be noted that although the present drawings depict only one active device region in the structure, a plurality of such active device regions may be present in the structure and the inventive method can be applied thereto.

Next, ultra-thin interfacial oxide, oxynitride and/or nitride layer 14 is formed on the substrate utilizing one of the processing techniques that will be mentioned hereinbelow in more detail. The ultra-thin interfacial oxide, oxynitride and/or nitride layer of the present invention has a thickness of less than about 10 Å, with a thickness of from about 2 to 8 Å being more highly preferred. The present invention also contemplates mixtures or multilayers of said oxide, oxynitride or nitride.

After formation of the interfacial oxide, oxynitride and/or nitride layer, the ultra-thin interfacial layer may be optionally patterned so that is present only above the active device region, or alternatively, patterning may occur after formation of the high-k material. Patterning is achieved utilizing any conventional patterning process such as lithography and etching. The lithography step includes applying a photoresist, patterning the photoresist and developing the pattern. The etching step includes any conventional dry etch process such as reactive-ion etching, ion-beam etching and plasma etching.

Figure 2:
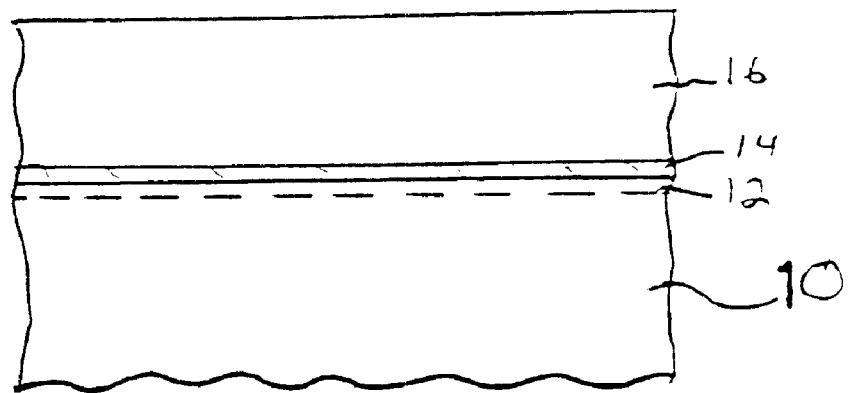

FIG. 2 shows the formation of a high-k dielectric material 16 on ultra-thin interfacial oxide, oxynitride and/or nitride layer 14. The term "high-k dielectric" denotes any dielectric material having a dielectric constant relative to a vacuum of greater than 8. Examples of such high-k dielectrics, include, but are not limited to: binary metal oxides such as $TiO_2$, $Ta_2O_5$, $Al_2O_3$, $Y_2O_3$, $ZrO_2$, $HfO_2$, $Gd_2O_3$, and $La_2O_3$; silicates and aluminates of said binary metal oxides; and perovskite-type oxides. Combinations and/or multilayers of such high-k dielectrics are also contemplated herein. The perovskite-type oxides may be in the crystalline or amorphous phase.

Examples of perovskite-oxides that may be employed in the present invention as the high-k dielectric material include, but are not limited to: a titanate system material, i.e., barium titanate, strontium titanate, barium strontium titanate, lead titanate, lead zirconate titanate, lead lanthanum zirconate titanate, barium zirconium titanate and barium lanthanum titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, and barium titanium niobate; or a Bi-layered perovskite system material such as strontium bismuth tantalate, and bismuth titanate.

Of the various high-k dielectrics mentioned above, preference is given to binary oxides or aluminate high-k materials. A highly preferred binary oxide employed in the present invention is $Al_2O_3$.

The high-k dielectric material is formed utilizing any conventional deposition process, including, but not limited to: chemical vapor deposition (CVD), atomic layer CVD, rapid thermal CVD, plasma-assisted CVD, sputtering, plating, evaporation, chemical solution deposition and other like deposition processes. The physical thickness of the high-k dielectric material employed in the present invention may vary depending on the dielectric constant and the deposition process used in forming the same. Typically, however, the high-k dielectric has a thickness of from about 10 to about 100 Å, with a thickness of from about 20 to about 50 Å being more highly preferred.

Following deposition of the high-k dielectric, the high-k dielectric material or both the high-k dielectric and the underlying ultra-thin interfacial layer may be patterned using the above mentioned lithography and etching steps. When both layers are to be patterned post deposition of the high-k dielectric, the etching step may include a combination of the aforesaid dry etching processes as well as the use of a chemical wet etch process.

The structure shown in FIG. 2 may then be subjected to any conventional CMOS processing scheme which is capable of forming a semiconductor device on the high-k dielectric layer. For example, conventional processing schemes that are capable of forming a transistor on the high-k dielectric may be employed in the present invention. It should be noted that when a transistor is fabricated, interfacial layer 14 and high-k dielectric layer 16 form the gate stack of the transistor.

The various techniques that can be used in the present invention in forming the ultra-thin interfacial layer will now be described in greater detail.

In one embodiment of the present invention, ultra-thin interfacial layer 14 may be formed utilizing a rapid thermal oxidation (RTO), oxynitridation (RTON) or nitridation (RTN) process which is carried out in an oxidizing ambient such as oxygen, NO, $N_2O$, $NH_3$ and other like oxidizing ambients. Combinations of these oxidizing ambients are also contemplated herein. The oxidizing ambient or combination thereof may also be used in conjunction with a carrier gas (or mixture of carrier gases) such as helium, argon, nitrogen or other like inert carrier gases. Combinations of the above rapid thermal processes such as RTA and RTN are also contemplated herein.

When the ultra-thin interfacial layer is to serve as a diffusion barrier, it is preferred that NO, $NH_3$, or $N_2O$-containing ambients be employed in the rapid thermal oxidation, oxynitridation or nitridation process. These nitrogen-containing oxidizing ambients serve to increase the N concentration present in the ultra-thin interfacial layer which, in turn, improves the diffusion resistance of the interfacial layer.

The RTO, RTON or RTN process may be carried out at atmospheric pressure or reduced pressures below atmospheric may be employed. Reduced pressures are preferred in the present invention since reduced pressures provide a slower growth rate and therefore allow for a more easily controlled process in the sub-10 Å regime. Typical pressure ranges that can be employed in the present invention are from about 10 to about 1000 Torr.

The RTO, RTON or RTN process is carried out at a temperature of about 400° C. or above and for a time period of from about 180 seconds or less. More specifically, the RTO, RTON or RTN process is carried out at a temperature of from about 600° to about 900° C. for a time period of from about 5 to about 60 seconds. Other temperatures and times that are capable of forming an ultra-thin interfacial oxide, oxynitride and/or nitride layer on a surface of a semiconductor substrate can also be used in the RTO, RTON or RTN process. The RTO, RTON or RTN process is carried out in a motionless chamber, or in a chamber in which rotation of the substrate is possible. Chamber rotation is preferred in the present invention since it aids in improving growth rate uniformity of the ultra-thin interfacial oxide, oxynitride and/or nitride layer.

The RTO, RTON or RTN process may be carried out utilizing a single temperature (with one ramp-up and one ramped down rate), or various ramp and soak cycles including varies rates and holding times can be employed. Typically, in the present invention, the ramp-up rate is from about 5 to about 100° C./second and the ramp down rate is from about 5 to about 50°/second. Other rates besides those specified herein can also be employed in the RTO, RTON or RTN process of the present invention. It should be noted that at a given temperature, a thicker interfacial layer can be formed by increasing the duration of the RTO, RTON or RTN process. Of the above processes, RTO is preferred in the present invention.

In another embodiment of the present invention, the RTO process mentioned above is used in conjunction with a remote or direct plasma nitridation or oxynitridation process which serves to increase the concentration of nitrogen atoms present in the ultra-thin interfacial layer. Specifically, the plasma nitridation process is carried out by exposing the wafer to a nitrogen-containing plasma such as $N_2$, $NH_3$, etc. for durations of from about 5 to about 300 seconds.

In a further embodiment of the present invention, the RTO process alone, or combined RTO and remote plasma nitridation process, can be used in conjunction with a nitrogen implantation process wherein nitrogen atoms are implanted into the ultra-thin interfacial layer using a low-implant energy (on the order of 10 keV or below).

In a still further embodiment of the present invention, the ultra-thin interfacial layer is formed utilizing a remote or direct plasma oxidation (RPO) process. The RPO process is carried out as follows: sample temperature of from about 300°–600° C., plasma oxidation time 0–300 minutes.

In yet another embodiment of the present invention, a wet chemical oxidation process is employed. The wet chemical oxidation process used in the present invention is carried out utilizing conventional conditions well known to those skilled in the art.

Specifically, the formation of an interfacial layer with a thickness of less than 10 Å can be achieved through the application of specific wet chemical mixtures, which form a very thin chemical oxide on silicon having the following advantages:

(1) the growth of wet chemical oxides is self limiting depending on the oxidation power of the chemistry (i.e. mixing ratios, etc.);

(2) wet chemical oxides can be grown free of contamination;

(3) the surface can be terminated by specific adsorbed species to enhance the nucleation of the high-k dielectric and with this improved film uniformity is obtained. For example, Al-hydroxide can be co-precipitated with dissolved silica onto the substrate surface, avoiding at the same time other metal contamination, which could be harmful to the dielectric quality. This method creates a reproducible density of nucleation sites; and (4) wet-chemical oxides can be grown so as to achieve thicknesses significantly below 10 Å (as measured after anneal).

Alternatively, thermally grown oxides, as described hereinbelow, can be treated with a wet chemical solution in order to change it's surface termination from a hydrophobic nature (siloxane rings) to a hydrophylic nature (silanol groups), e.g., by using a high pH solution such as ammonium hydroxide. Also nucleation sites can be created by specific precipitation of selected elements onto the substrate's surface, as discussed in (3) above.

Chemistries, which can be applied are acidic or basic in pH and contain an oxidizing agent, which is capable of oxidizing the surface of the substrate.

Examples of such mixtures are:

hydrogen peroxide/ammonium hydroxide (or other inorganic or organic bases)/water hydrogen peroxide/inorganic acid (hydrochloric acid, sulfuric acid, nitric acid, etc.)/water Ozone dissolved in deionized water or deionized water+ inorganic acid or base The oxidation rate and final oxide thickness can be modulated by changing mixing ratios of the components and the concentration of the oxidizing agent, by varying the temperature, pH or treatment time.

Another technique that can be employed in the present invention in forming the ultra-thin interfacial layer is by using an ozone process in which ozone is used to grow an ultra-thin interfacial layer. The ozone process may be carried out using the RTO temperatures or times mentioned above or conventional furnace conditions which include much longer heating times may be used.

The ultra-thin interfacial layer may also be formed by a low-energy oxygen ion implantation process (the energy of which is on the order of 5 keV or less) followed by a rapid thermal anneal (RTA) process that is carried out in an inert gas such as $N_2$. The RTA process may be carried out at a temperature of from about 700° to about 1100° C. for a time period of from about 5 to about 60 seconds. A single temperature may be employed, or various ramp and soak cycles may be used in the RTA process.

Other means for forming the ultra-thin interfacial layer of the present invention are to combine the above mentioned RTO process with steam which may be generated in-situ using conventional $H_2+O_2$ chemistry or externally. The steam processes are typically, but not necessarily, carried out in an inert carrier gas and at low-pressures and temperatures. The term "low-pressure" denotes a steam pressure of less than 100 Torr, with a pressure of from about 10 to about 50 Torr being highly preferred. The term "low-temperature" is used herein to denote a temperature of less than 1000° C., with a temperature of from about 800° to about 900° C. being more highly preferred. When steam is employed, it is preferred that the steam contain a low-concentration of hydrogen therein. Specifically, when steam is employed, the H concentration of the steam is typically less than 20 weight %.

Of these various techniques mentioned above, it is highly preferred that the ultra-thin interfacial layer be formed by RTO using NO as an oxidizing ambient.

The use of the ultra-thin interfacial layer of the present invention in CMOS devices results in a device having improved physical as well as electrical properties. Specifically, the use of the ultra-thin interfacial layer in a stack containing a high-k dielectric results in a device that exhibits substantially little leakage and good thermal stability. Moreover, no substantial interfacial layers are observed in the substrate after deposition of the high-k dielectric and subsequent thermal processing when the method of the present invention is employed.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for fabricating a semiconductor device including a high-k dielectric material therein comprising the steps of:
   (a) forming an interfacial layer on a device region of a semiconductor substrate, said interfacial layer comprising an oxynitride, nitride or mixtures and multilayers thereof and having a thickness of less than 10 Å; and
   (b) forming a high-k dielectric layer on said interfacial layer, said high-k dielectric having a dielectric constant, k, of greater than 8.

2. The method of claim 1 wherein said interfacial layer is formed by a rapid thermal oxynitridation (RTON) process, a rapid thermal nitridation (RTN) process or combinations thereof.

3. The method of claim 2 wherein said RTON or RTN process is carried out in an ambient including NO, $N_2O$ or combinations thereof.

4. The method of claim 3 wherein said ambient is used in conjunction with an inert carrier gas.

5. The method of claim 2 wherein said RTON or RTN process is carried out at atmospheric or a reduced pressure below atmospheric.

6. The method of claim 2 wherein said RTON or RTN process is carried out at a temperature of about 400° C. or above for a time period of from about 180 seconds or less.

7. The method of claim 6 wherein said RTON or RTN process is carried out at a temperature of from about 700° to about 900° C. for a time period of from about 5 to about 60 seconds.

8. The method of claim 2 further comprising a remote or direct plasma nitridation or oxynitridation process.

9. The method of claim 8 wherein said nitridation process includes exposure to a nitrogen-containing plasma for about 5 to about 300 seconds.

10. The method of claim 8 further comprising an nitrogen implantation process, said nitrogen implantation being carried out at an energy of 10 keV or below.

11. The method of claim 2 further comprising a nitrogen implantation process, said nitrogen implantation being carried out at an energy of 10 keV or below.

12. The method of claim 1 wherein said high-k dielectric layer is a binary oxide, a silicate or aluminate of a binary oxide, a perovskite-type oxide or any combination or multilayer thereof.

13. The method of claim 12 wherein said perovskite type oxide includes a titanate system material, a niobate system material, a tantalate system material, a tungsten-bronze system or a Bi-layered perovskite system material.

14. The method of claim 1, wherein said interfacial layer further comprises an oxide.

15. The method of claim 14 wherein said oxide is formed by a remote or direct plasma oxidation process.

16. The method of claim 15 wherein said plasma oxidation process includes $O_2$ plasma immersion of Si wafers for about 5 to about 300 seconds.

17. The method of claim 14 wherein said oxide is formed by an ozone process.

18. The method of claim 14 wherein said oxide is formed by a low-energy oxygen implantation process and a rapid thermal anneal process.

19. The method of claim 18 wherein said low-energy oxygen implantation process is carried out using an energy of 5 keV or below.

20. The method of claim 18 wherein said rapid thermal anneal is carried out at a temperature of from about 700° to about 1100° C. for a time period of from about 5 to about 60 seconds.

21. The method of claim 14, wherein said oxide is formed by a rapid thermal oxidation (RTO) process.

22. The method of claim 1 wherein step (a) is carried out in a chamber that is capable of rotating said substrate.

* * * * *